United States Patent [19]
Haase

[11] Patent Number: 4,767,146
[45] Date of Patent: Aug. 30, 1988

[54] HOLDING TONGS

[75] Inventor: Peter Haase, Feucht, Fed. Rep. of Germany

[73] Assignee: Schering Aktiengesellschaft, Berlin and Bergkamen, Fed. Rep. of Germany

[21] Appl. No.: 36,881

[22] Filed: Apr. 10, 1987

[30] Foreign Application Priority Data

Apr. 11, 1986 [DE] Fed. Rep. of Germany ....... 3612220

[51] Int. Cl.$^4$ .............................................. B66C 1/48
[52] U.S. Cl. ................................ 294/104; 294/81.61; 294/902
[58] Field of Search ................. 294/81.51, 81.6, 81.61, 294/86.4, 87.1, 101, 104, 106, 110.1, 118, 901, 902; 118/500, 503; 269/265, 266; 271/82, 85, 204, 205

[56] References Cited

U.S. PATENT DOCUMENTS

| | | | |
|---|---|---|---|
| 2,115,106 | 4/1938 | Hinsey | 294/81.61 X |
| 2,411,319 | 11/1946 | Duarte | 294/104 |
| 2,654,630 | 10/1953 | Renfroe | 294/104 |
| 2,788,210 | 4/1957 | Sperry | 271/85 X |
| 3,100,637 | 8/1963 | Brown | 271/205 |
| 4,284,301 | 8/1981 | Geiger et al. | 294/104 |
| 4,632,444 | 12/1986 | Martinez et al. | 294/104 X |

Primary Examiner—Johnny D. Cherry
Attorney, Agent, or Firm—Michael J. Striker

[57] ABSTRACT

Holding tongs for holding printed circuit boards suspended in a galvanizing bath includes two halves, of which the movable half is subdivided into two portions pivotable relative to the stationary half of the tongs against the action of the springs. Both halves of the tongs have clamping projections to clamp the boards in a suspended position.

5 Claims, 6 Drawing Sheets

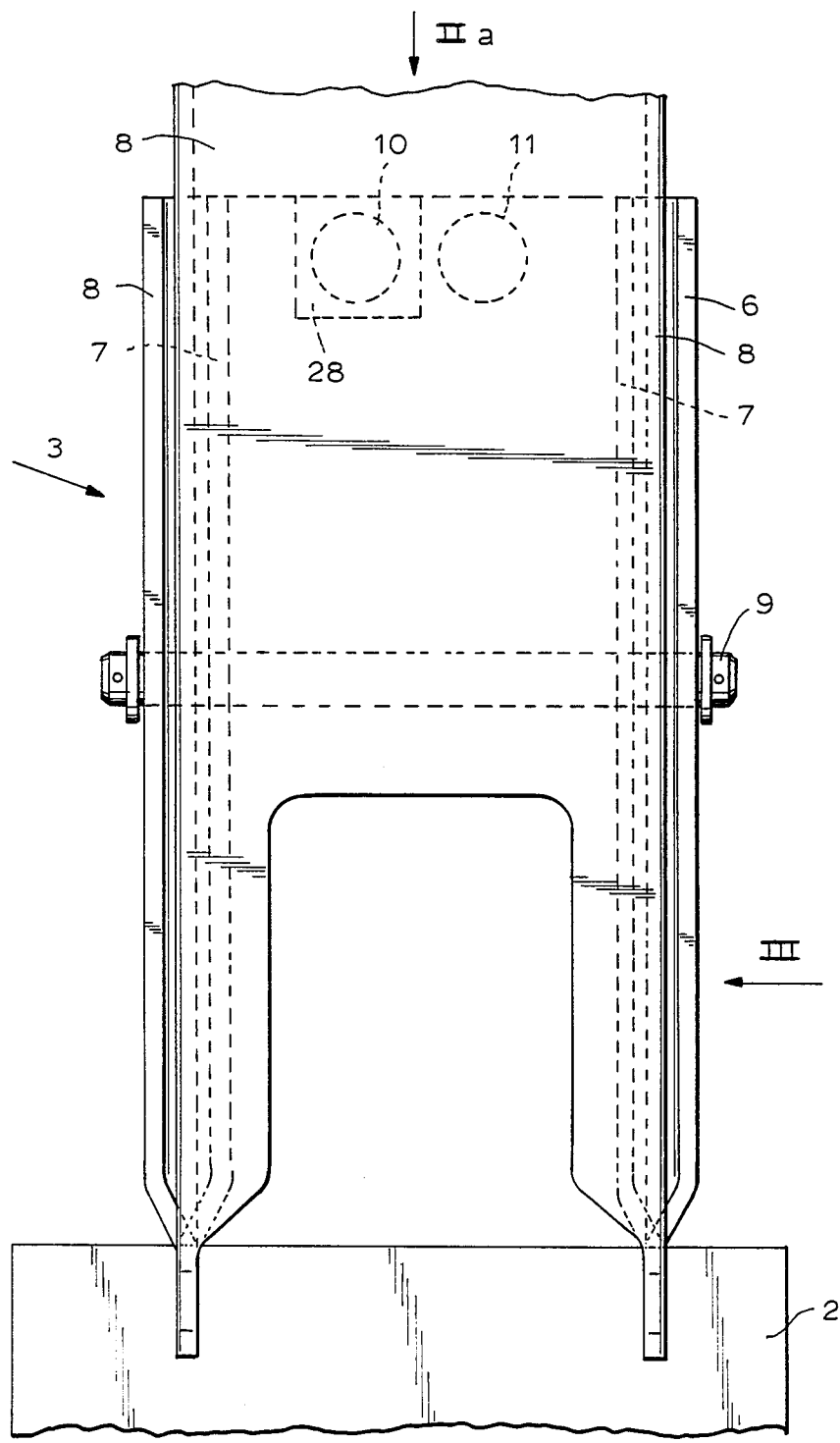
F I G. 2

HOLDING TONGS

BACKGROUND OF THE INVENTION

The present invention pertains to holding tongs for clamping or seizing plates or plate-shaped objects which are to be inserted into or removed from a galvanizing bath.

Holding tongs of the type under consideration include two halves provided with clamping projections so that the clamping projection formed on one half of the tongs lies centrally between the two clamping projections of the other half, as seen in the direction of elongation of the tongs. Such conventional holding tongs are disadvantageous in that the tongs must grasp the plates being treated at their edges whereby the oscillating motion of the plate about the clamping place should be maintained as small as possible. If the distance between two clamping projections is designated at L the actual lever arm due to the central position of the clamping projection of the other half of tongs would be L/2. To compensate for this disadvantage a spring force on the clamping projections must be increased. This is however limited because with the high spring force there is the danger that the thin edge of the plate held by the tongs could be pressed and damaged by the centrally positioned clamping projection. If the distance L between two projections of one half of the tongs is increased the edge of the plate reserved for holding should be accordingly greater. The edge area of the plate to be galvanized is however selected so that the effective surface of the plate to be galvanized should be reduced. The known arrangement has been disclosed in DE-GM No. 8422297.

SUMMARY OF THE INVENTION

It is an object of the present invention to provide the improved holding tongs for holding plates, for example printed circuit boards, in a suspended position in a galvanizing bath.

It is another object of the invention to provide the holding tongs in which an effective lever arm for holding respective plates would be doubled in size without requiring the increase in the edge area of the plate to be held.

These and other objects of the invention are attained by the holding tongs for clamping plates or plate-shaped objects to be suspended in and removed from galvanizing baths, comprising two halves biased by springs so that due to a spring action said halves having clamping projections press with said projections against a plate to be clamped, a first one of said halves being subdivided into two movable portions, a second one of said halves being fixed, each of said portions being pivotable relative to said fixed second half under said spring action, each of said movable portions having a clamping projection, said fixed second half having two clamping projections each corresponding to a respective clamping projection of said movable portions and lying opposite thereto in a clamping position. Thereby the distance L between the oppositely lying clamping projections of each half in the clamping position is practically doubled as compared to that of conventional tongs of the foregoing type. The necessary width of the edge area of the plate being suspended in the galvanizing bath remains, however the same as in conventional tongs.

Since the first half of the holding tongs is subdivided into two portions, each portion is pivotable relative to the second half of the tongs. This results in the fact that each clamping projection of each separate portion of the movable half of the tongs lies against the assigned clamping projection of the fixed half. The plate edge is also maintained at the distance L from two pairs of respective clamping projections with a corresponding clamping force. Changes in the thickness of the plates being clamped do not affect the function of the tongs.

The fixed half may have a supporting extension, the tongs further including a support on a galvanizing device, said supporting extension being suspended on said support.

The tongs includes a pivot axle, said movable portions being pivotable about said pivot axle relative to said fixed half.

Each of said portions and said fixed half may include a base wall and side walls extended from said base wall at right angles, each side wall having an opening for receiving said axle.

Each movable portion and said fixed half may include arms laterally extended from said base wall towards said side walls, said arms supporting said clamping projections.

The base walls may form bearings for supporting springs for biasing said halves, said springs being parallel to each other and operating independently from each other for actuating a respective movable portion.

One of said movable portions may be narrower than the other, said side walls of said movable portions and said fixed half overlapping each other so that the side walls of said narrower portion are positioned between the side walls of said fixed half and said side walls of a wider portion.

The base wall of said narrower portion may have a recess for passing therethrough of one of said springs.

The clamping projections of said movable portions and said fixed half may be interchangeably supported on the respective halves of the tongs.

In order to make the pivoting of the movable half against the spring action easier the distance between the gripping point and the pivot axis laterally of the operator is the same.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWINGS

FIG. 2 is a plan view of the holding tongs of the invention;

DETAILED DESCRIPTION OF THE PREFERRED EMBODIMENT

Figure 1:
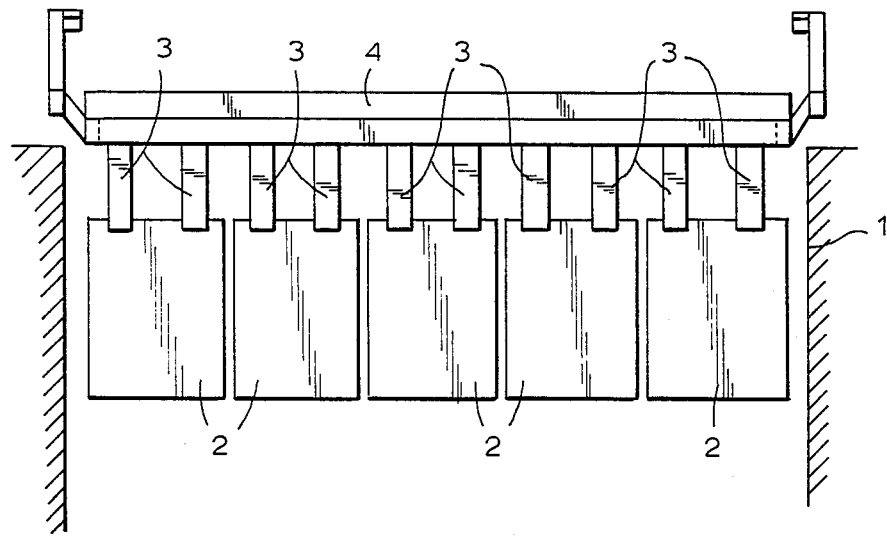
FIG. 1 is a schematic side view of the arrangement of holding tongs according to the invention in a galvanizing installation.

Referring now to the drawings in detail it will be seen that FIG. 1 shows a plurality of plates which are here printed circuit boards 2 which are to be galvanized and therefor are held by means of holding tongs 3. The holding tongs are in turn secured in a support 4 or suspended thereon. Printed circuit boards 2 to be galvanized are lowered into the galvanizing bath by means of the support 4 and tongs 3 and removed by the same means from the bath after the galvanizing process has been completed.

Figure 2A:
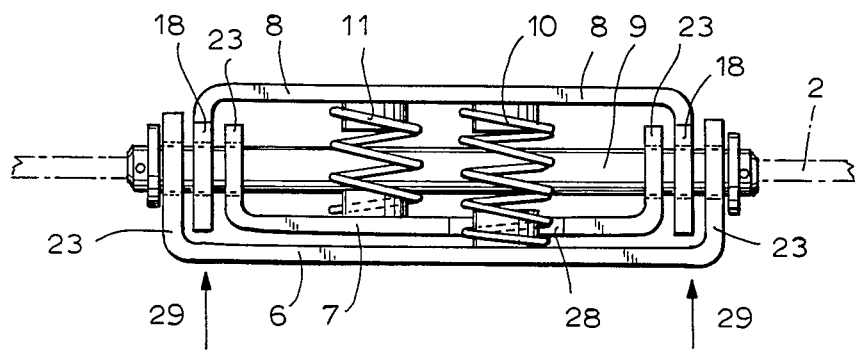
FIG. 2a is a view taken from arrow IIa of FIG. 2.
Figure 3:
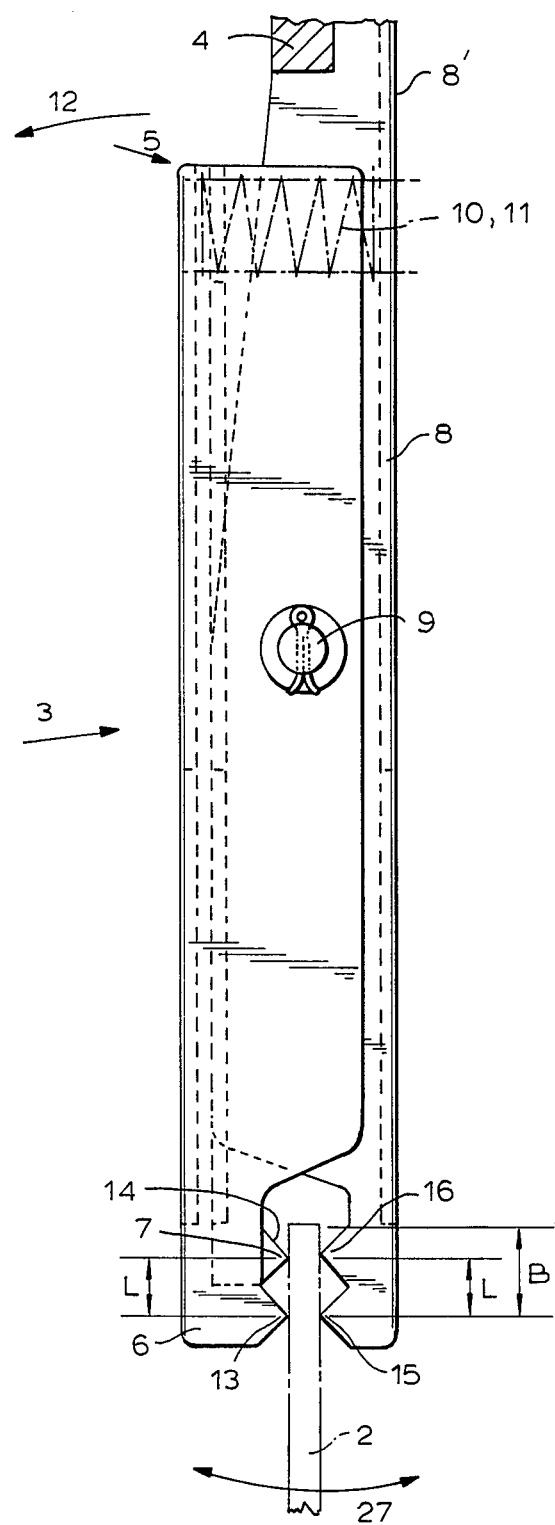
FIG. 3 is a view taken from arrow III of FIG. 2.

FIGS. 2, 2a and 3 illustrate individual holding tongs 3, in which the first movable half 5 is subdivided into two portions 6 and 7. The second, stationary half 8 of the holding tongs of the invention is pivotally connected with both portions 6, 7 of the first half 5 via a pivot axis 9 which is common to those both portions 6, 7.

A part 8' positioned above stationary half 8 serves the purpose of suspending on or connecting of the tongs to the support 4.

Two compression springs 10, 11 are provided, which facilitate the pivoting of movable portions 6, 7 in the direction of arrow 12 about axis 9, as shown in FIG. 3. Each of the movable portions 6, 7 is provided at its end with a clamping prejection 13, 14, these projections being spaced from each other by distance L. Two clamping projections 15, 16 provided on the second stationary half 8 of the tongs are also spaced from each other by the same distance L. Projections 15, 16 of the fixed half 8 of the tongs lie in the clamping position (FIG. 3) against the respective projections 13, 14 of the portions 6, 7 of the movable half of the tongs so that under pressure of springs 10, 11, printed circuit boards 2 are reliably held between the halves of the tongs. Inasmuch as the assigned compression spring 10 or 11 belongs to each movable portion 6, 7 these portions of the tongs swivel and can abut against the printed circuit board 2 with a respective clamping force. Printed circuit boards of various thickness could be supported by the same holding tongs due to the fact that both pairs of clamping projections 14, 16 and 13, 15 seize the printed circuit boards at the distance L. This would not be possible if the movable half of the holding tongs were not subdivided into two portions. In the latter case the change in thickness of the plate to be clamped, for example a printed circuit board, would have the effect that either the pair of clamping projections 14, 16 or the pair of clamping projections 13, 15 would not be able to grasp any plate.

The plate 2 has the tendency of pivoting back and forth in the directions of arrow 27 as shown in FIG. 3. This pivoting must be prevented or at least reduced by the forces of springs 10, 11 in connection with the clamping holding and the lever arm L formed thereby. The greater is the lever arm L with the smallest nongalvanized part e.g. width B of the edge of plate 2, the more effectively is utilized the plate surface. In practice, this width B is maintained smaller than 15 mm.

The clamping force exerted by the pairs of clamping projections 14, 16 and 13, 15 is uniform. The halves 8 and 6, 7 are in a simple fashion stamped out from a sheet material and bent.

Figures 4, 5:
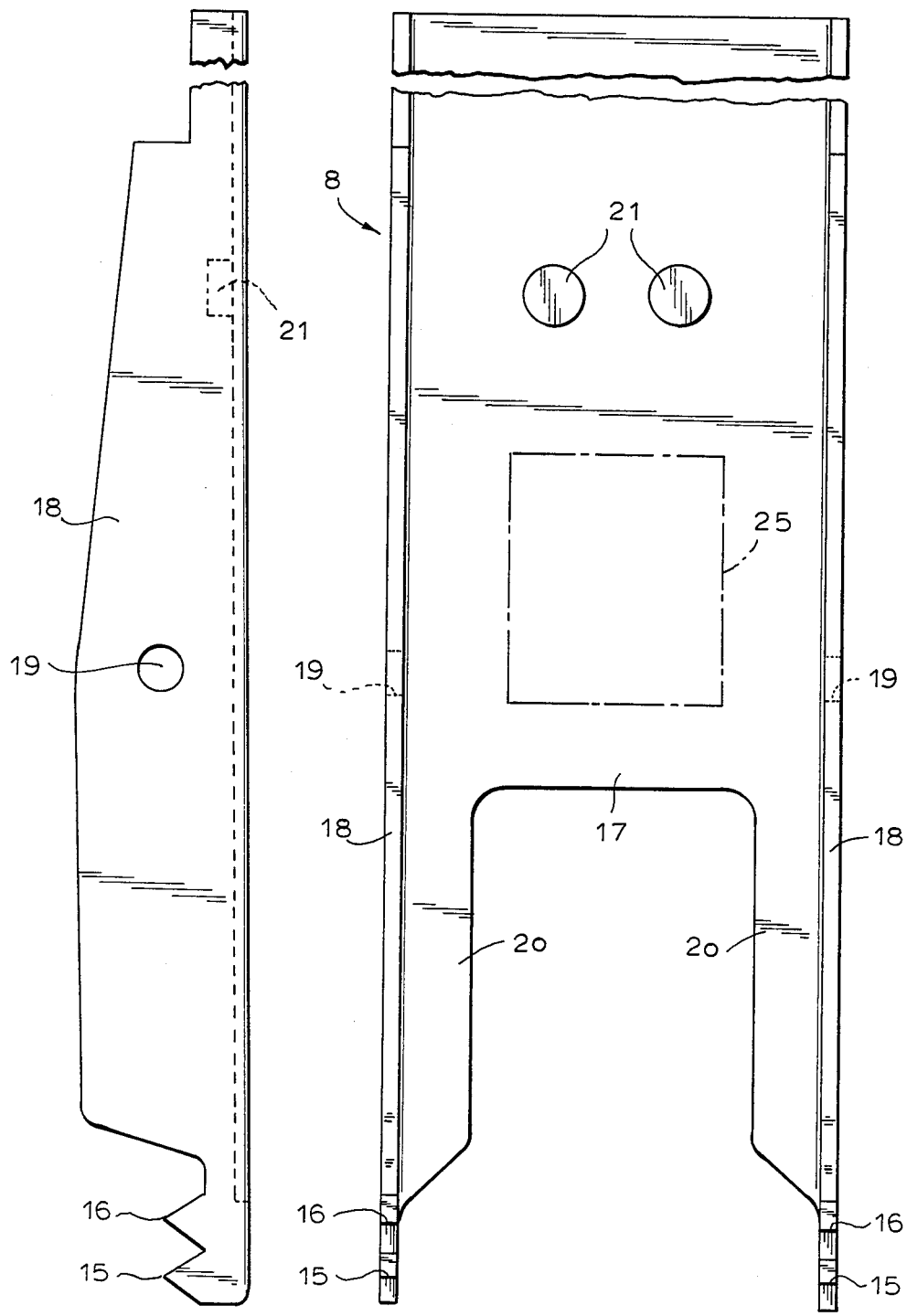
FIG. 4 is a plan view of the second half of the tongs of the invention.
FIG. 5 is a side view of the second half of the holding tongs of the invention.
Figures 6, 7:
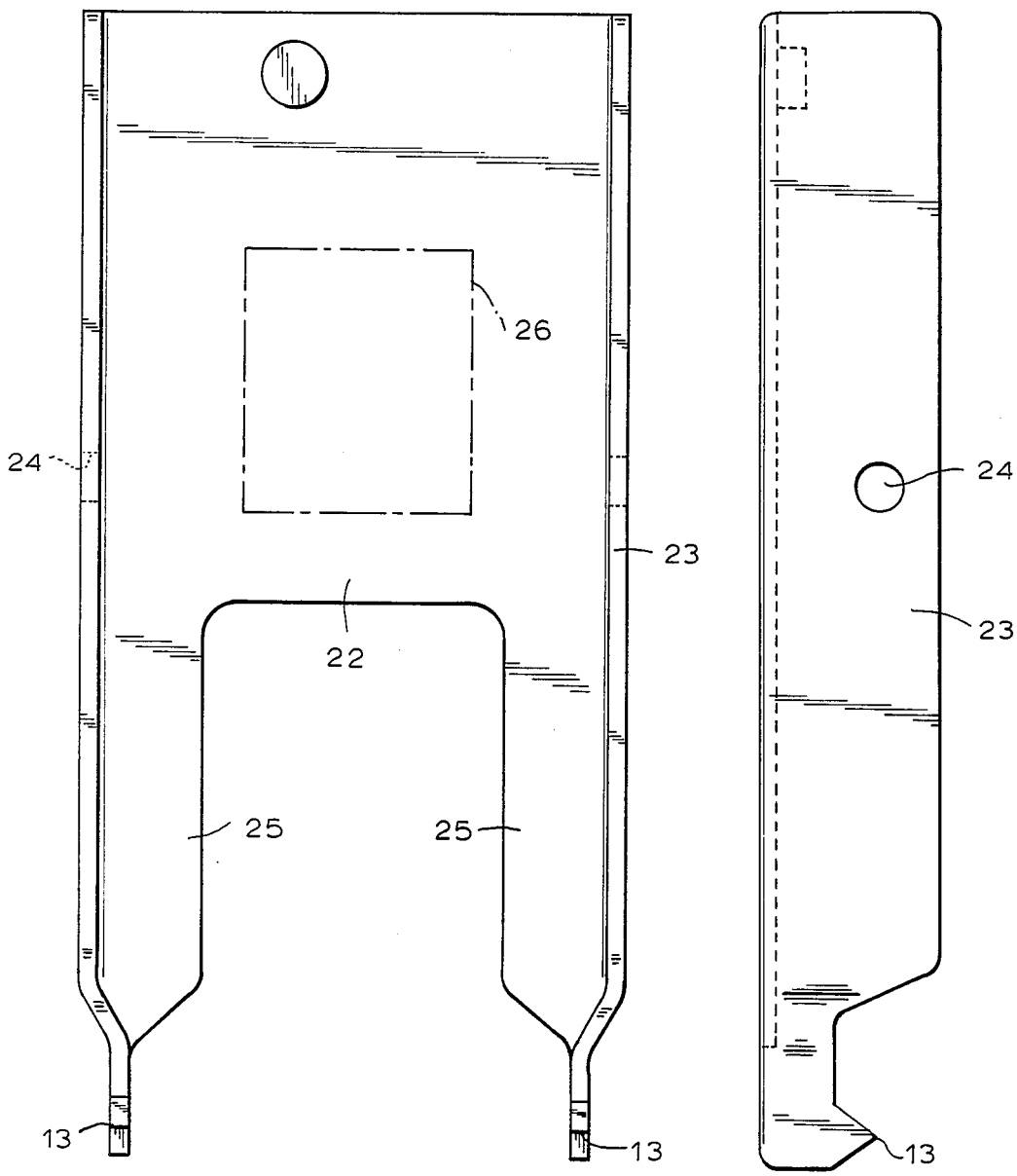
FIG. 6 is a plan view of the one portion of the first half of the tongs.
FIG. 7 is a side view of the one portion of the first half of the tongs.
Figures 8, 9:
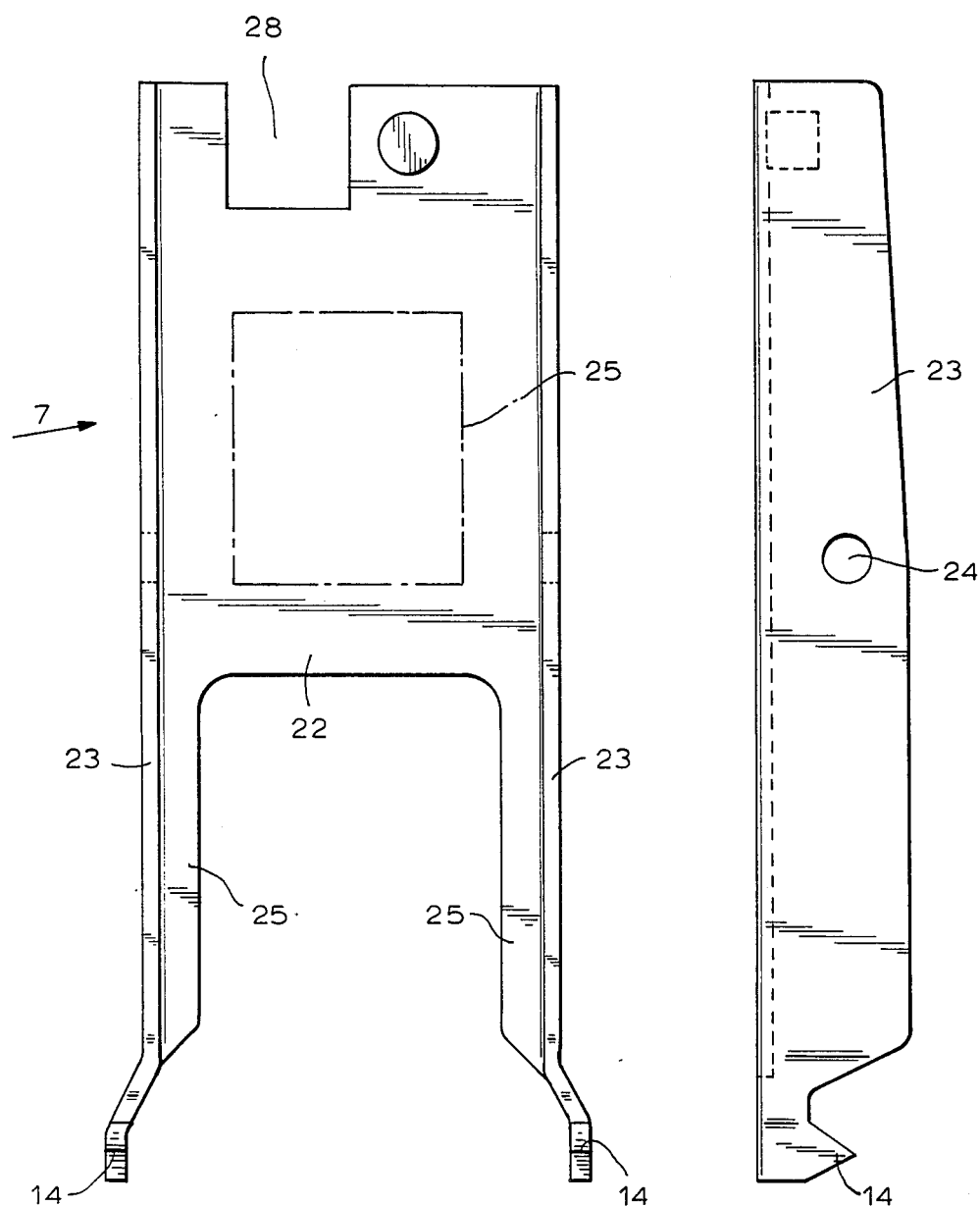
FIG. 8 is a plan view of another portion of the first half of the tongs.
FIG. 9 is a side view of another portion of the first half of the tongs.

FIGS. 4 and 5 depict the second, e.g. fixed half 8 of the tongs. This fixed half includes a base plate 17 with side walls 18 bent out to extend at right angles to the surface of the base plate. The side edges or walls 18 each have a bore 19 to receive the axle 9. Portions 20 extend between the base plate 17 and the side walls 18, these portions supporting clamping projections 15, 16. These clamping projections can be, as well as clamping projections 13, 14, separate and be formed as interchangeable detachably-attachable parts. These claming projections are the most loadable structural components of the holding tongs. If these clamping projections are worn out only a new tip could be reinserted into the same tongs and they could be used further. Reference numeral 21 designates bearings for retaining compression springs 10, 11.

Both movable portions 6, 7 of the movable half, as seen from FIGS. 6, 7 and 8, 9, are formed substantially similarly to the fixed half 8, but have dimensions different from those of the fixed half 8. Movable portions 6, 7 and the fixed half 8 can spatially pass into each other, as shown particularly in FIGS. 2 and 2a. The base plate of each movable portion 6, 7 is designated by reference numeral 22. Bent-out side walls of each portion 6, 7 are denoted at 23. These side walls or edges 23 have bores 24 to receive the axle 9.

As seen form FIGS. 2 and 2a the narrower portion 7 has a recess 28 which is penetrated by the compression spring 10. Thereby spring 10 is supported between the bottom of the portion 6 and fixed half 8 whereas the compression spring 11 is supported between the bottom wall of portion 7 and the fixed half 8 of the tongs. The pressures which occur under the side wall of portion 6 are firstly exerted by the compression of spring 10 and then, upon the reaching of the portion 7, by the compression of spring 11, whereby the clamping position shown in FIG. 3 is released, and plate 2 can be removed from the tongs. As soon as the force in the direction of arrows 29 (FIG. 2a) is taken off, springs 10, 11 will again press the clamping projections of portions 6, 7 against the plate 2 and, of course, against the clamping projections of the fixed half 8 of the tongs.

Arms 25 (FIGS. 6 to 9) formed by the base plates or bottoms 22 and side walls 23 support respective clamping projections 13 or 14. Thereby the projections 14 lie on the internal and thus narrow movable portion 7 while the projections 13 lie on the wider movable portion 6, the side walls 23 of which overlap the fixed portion 8 and the side walls of the narrower movable portion 7 (FIG. 2a). FIG. 2a further shows that the distance between the side walls 18 of the fixed half 8 of the tongs is selected so that the side walls 18 are positioned between the side walls 23 of portions 6, 7.

The even constructions of the two halves 6, 7 and 8 facilitate the so-called cleansing ability. There is such a technique in the galvanic technology in which a complete rinsing of the bath residues is provided. For this purpose, the free space between respective arms 20 and 25 can serve. Furthermore, a portion 26 of the bottom or base wall 17 or 22 is recessed or stamped in order to improve the aforementioned cleansing ability.

It will be understood that each of the elements described above, or two or more together, may also find a useful application in other types of holding tongs differing from the types described above.

While the invention has been illustrated and described as embodied in a holding tongs, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. Holding tongs for clamping plates or plate-shaped objects to be suspended in and removed from galvanizing baths, comprising two halves having clamping projections and being biased by springs so that due to a spring action the clamping projections of said two halves press against a plate to be clamped, a first one of said halves being subdivided into two movable portions, a second one of said halves being fixed, each of said portions being pivotable relative to said fixed second half under said spring action, each of said movable portions having a clamping projection (13, 14), said fixed second half having two clamping projections (15, 16) each corresponding to a respective clamping projection of said movable portions and lying opposite thereto in a clamping position; and a pivot axle (9), said movable portions being pivotable about said pivot axis relative to said fixed half, each of said portions and said fixed half including a base wall and side walls (23, 18) extended from said base wall at right angles, each side wall having an opening receiving said pivot axle (9), each movable portion and said fixed half including arms laterally extended from said base wall towards said side walls, said arms (25, 20) supporting said clamping projections.

2. Holding tongs as defined in claim 1, wherein said fixed half (8) has a supporting extension (8'), and further including a support (4) of a galvanizing device, said supporting extension being suspended on said support.

3. Holding tongs as defined in claim 1, wherein said base walls form bearings for supporting said springs for biasing said halves, said springs (10, 11) being parallel to each other and operating independently from each other for actuating a respective movable portion.

4. Holding tongs as defined in claim 3, wherein one of said movable portions is narrower than the other, said side walls of said movable portions and said fixed half overlapping each other so that the side walls of said narrower portion (7) are positioned between the side walls (18) of said fixed half (8) and said side walls (23) of a wider portion.

5. Holding tongs as defined in claim 4, wherein the base wall of said narrower portion has a recess (28) for passing therethrough of one of said springs (10).

* * * * *